United States Patent
Zhang et al.

(10) Patent No.: US 11,048,371 B2
(45) Date of Patent: Jun. 29, 2021

(54) ORGANIC LIGHT EMITTING DISPLAY PANEL AND DISPLAY DEVICE

(71) Applicant: WuHan TianMa Micro-Electronics Co., Ltd., Wuhan (CN)

(72) Inventors: Guofeng Zhang, Wuhan (CN); Zhaokeng Cao, Shanghai (CN); Linshan Guo, Wuhan (CN); Tianqing Hu, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/705,239

(22) Filed: Dec. 6, 2019

(65) Prior Publication Data

US 2020/0110490 A1  Apr. 9, 2020

(30) Foreign Application Priority Data

Apr. 9, 2019 (CN) .......................... 201910280961.5

(51) Int. Cl.
*H01L 27/32* (2006.01)
*G06F 3/044* (2006.01)
(Continued)

(52) U.S. Cl.
CPC ............ *G06F 3/047* (2013.01); *G06F 3/0443* (2019.05); *H01L 27/323* (2013.01);
(Continued)

(58) Field of Classification Search
CPC . G06F 2203/04103; G06F 2203/04111; G06F 2203/04112; G06F 3/04164;
(Continued)

(56) References Cited

U.S. PATENT DOCUMENTS 10,367,052 B2 * 7/2019 Zhang .................. G09G 3/3225
10,559,597 B1 * 2/2020 Li ............................ G09G 3/20
(Continued)

FOREIGN PATENT DOCUMENTS

| CN | 106940605 A | 7/2017 |
| CN | 108122956 A | 6/2018 |
| CN | 108897454 A | 11/2018 |

OTHER PUBLICATIONS

Office Action of Chinese Patent Application No. 201910280961.5 dated Sep. 18, 2020.

*Primary Examiner* — Julie Anne Watko
(74) *Attorney, Agent, or Firm* — Kilpatrick Townsend & Stockton, LLP (57) ABSTRACT

An organic light emitting display panel and a display device are provided. The organic light emitting display panel includes: a driving device film layer, a light emitting device film layer, an encapsulation film layer and a touch film layer that are sequentially stacked; the touch film layer includes a touch cross bridge metal layer, a touch insulation layer and a touch electrode metal layer that are sequentially stacked; the organic light emitting display panel includes a display region, and the display region includes an edge display region and a non-edge display region, and the edge display region includes a profiled edge display region; at least one of the cross bridge metal layer and the touch electrode metal layer includes a dummy metal wire and a signal metal wire. The dummy metal wire is located in the profiled edge display region.

16 Claims, 11 Drawing Sheets

(51) Int. Cl.
    *H01L 51/50*    (2006.01)
    *G06F 3/047*    (2006.01)
    *H01L 51/52*    (2006.01)
    *G06F 3/041*    (2006.01)
(52) U.S. Cl.
    CPC ...... *H01L 27/3276* (2013.01); *H01L 51/5253* (2013.01); *G06F 3/0412* (2013.01); *G06F 3/0446* (2019.05); *G06F 2203/04111* (2013.01); *G06F 2203/04112* (2013.01)
(58) Field of Classification Search
    CPC .......... G06F 3/0412; G06F 2300/0413; G06F 3/0416; G06F 3/047; G06F 3/044; G06F 3/041; G06F 3/03; G06F 3/00; G06F 2203/041; G06F 2203/00; G06F 3/0443; G06F 3/0446; H01L 27/323; H01L 27/3276; H01L 51/5253; H01L 51/5237; H01L 51/5203; H01L 51/5209; H01L 51/5225; H01L 51/52; H01L 51/5012; H01L 51/50; H01L 51/00; H01L 27/3225; H01L 27/32; H01L 27/27; H01L 27/00; G09G 2300/0404; G09G 2300/0421; G09G 2300/0426; G09G 2300/043; G09G 2300/04; G09G 2300/00; G06K 9/0002
    See application file for complete search history.

(56) References Cited

U.S. PATENT DOCUMENTS

| | | | | |
|---|---|---|---|---|
| 10,629,658 | B1* | 4/2020 | Zhang | H01L 51/5253 |
| 2009/0315859 | A1* | 12/2009 | Chien | G06F 3/0446 |
| | | | | 345/175 |
| 2012/0075232 | A1* | 3/2012 | Golovchenko | G06F 3/0445 |
| | | | | 345/174 |
| 2012/0256647 | A1* | 10/2012 | Tao | G06F 3/0418 |
| | | | | 324/686 |
| 2014/0184560 | A1* | 7/2014 | Adachi | G02F 1/134336 |
| | | | | 345/174 |
| 2014/0253499 | A1* | 9/2014 | Lee | G06F 3/0445 |
| | | | | 345/174 |
| 2014/0299361 | A1* | 10/2014 | Nakamura | H05K 1/0296 |
| | | | | 174/253 |
| 2015/0177872 | A1* | 6/2015 | Kim | G06F 3/04166 |
| | | | | 345/174 |
| 2015/0212537 | A1* | 7/2015 | Cok | G06F 3/0416 |
| | | | | 345/174 |
| 2015/0220204 | A1* | 8/2015 | Noguchi | G06F 3/044 |
| | | | | 345/174 |
| 2015/0277485 | A1* | 10/2015 | Kosugi | G06F 3/0416 |
| | | | | 345/174 |
| 2015/0324046 | A1* | 11/2015 | Lo | G06F 3/0416 |
| | | | | 345/173 |
| 2015/0370356 | A1* | 12/2015 | Hwang | G06F 3/041 |
| | | | | 345/173 |
| 2016/0291759 | A1* | 10/2016 | Kurasawa | G02F 1/13338 |
| 2017/0153762 | A1* | 6/2017 | Kim | G06F 3/0445 |
| 2017/0185202 | A1* | 6/2017 | Qu | G02F 1/133514 |
| 2017/0200772 | A1* | 7/2017 | Yoshida | H01L 27/3223 |
| 2017/0249896 | A1* | 8/2017 | Kim | H01L 27/124 |
| 2018/0039360 | A1* | 2/2018 | Akimoto | G06F 3/0412 |
| 2018/0157354 | A1* | 6/2018 | Blondin | G06F 3/04164 |
| 2019/0004638 | A1* | 1/2019 | Lee | G06F 3/047 |
| 2019/0302936 | A1* | 10/2019 | Clark | G06F 3/0412 |
| 2020/0026385 | A1* | 1/2020 | Lee | G06F 3/0416 |
| 2020/0073500 | A1* | 3/2020 | Jeong | H01L 27/3244 |
| 2020/0106053 | A1* | 4/2020 | Xiao | H01L 27/3246 |
| 2020/0251682 | A1* | 8/2020 | Guo | G06F 3/0443 |

* cited by examiner

ORGANIC LIGHT EMITTING DISPLAY PANEL AND DISPLAY DEVICE

CROSS-REFERENCE TO RELATED APPLICATIONS

The present application claims priority to Chinese Patent Application No. 201910280961.5, filed on Apr. 9, 2019, the content of which is incorporated herein by reference in its entirety.

FIELD

The present disclosure relates to the field of display technologies, and more particularly, to an organic light emitting display panel and a display device.

BACKGROUND

In an organic light emitting display panel, in order to more fully utilize space or provide a better aesthetic appearance, an organic light emitting display panel having a profiled edge, such as a rounded edge or an edge having a cutout, is developed.

However, wire breakage is likely to occur to a touch electrode at the profiled edge, which results in poor touch effect.

SUMMARY

Embodiments of the present disclosure provide an organic light emitting display panel and a display device, capable of solving the problem of poor touch effect caused by wire breakage of a touch electrode at a profiled edge.

In one embodiment of the present disclosure an organic light emitting display panel is provided, including: a driving device film layer, a light emitting device film layer, an encapsulation film layer and a touch film layer that are sequentially stacked. The touch film layer comprises a bridging metal layer, a touch insulation layer and a touch electrode metal layer that are sequentially stacked. The organic light emitting display panel has a display region, the display region comprises an edge display region and a non-edge display region, and the edge display region comprises a profiled edge display region. At least one of the bridging metal layer and the touch electrode metal layer comprises a dummy metal wire and a signal metal wire, the dummy metal wire being located in the profiled edge display region.

Embodiment of the present disclosure further provides a display device including the above organic light emitting display panel.

BRIEF DESCRIPTION OF DRAWINGS

Embodiments of the present disclosure are illustrated by the accompanying drawings used in the embodiments are briefly described below. The drawings described below are merely a part of the embodiments of the present disclosure.

DESCRIPTION OF EMBODIMENTS

Embodiments of the present disclosure are described in details with reference to the drawings. It should be clear that the described embodiments are merely part of the embodiments of the present disclosure rather than all of the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
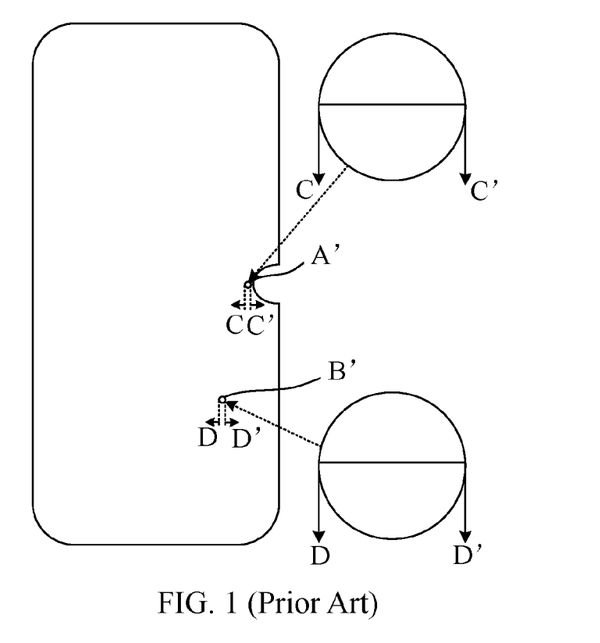
FIG. 1 illustrates a structural schematic diagram of an organic light emitting display panel in the related art.
Figure 2:
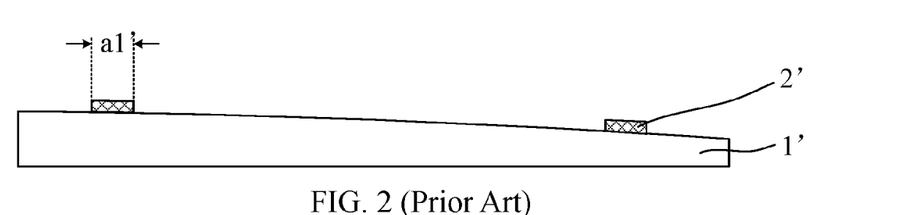
FIG. 2 illustrates a cross-sectional structural schematic diagram of a region A' in FIG. 1.
Figure 3:
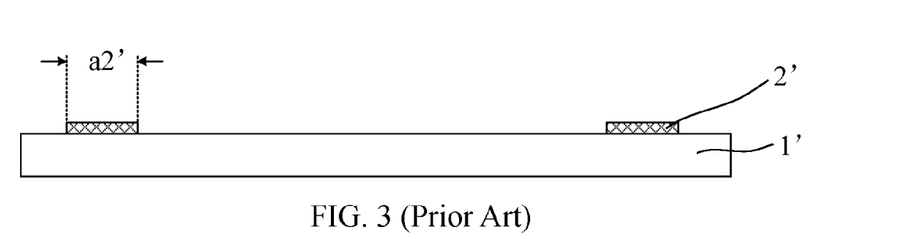
FIG. 3 illustrates a cross-sectional structural schematic diagram of a region B' in FIG. 1.

As shown in FIG. 1, FIG. 2 and FIG. 3, FIG. 1 illustrates a structural schematic diagram of an organic light emitting display panel in the related art; FIG. 2 illustrates a cross-sectional structural schematic diagram of a region A' in FIG. 1; FIG. 3 illustrates a cross-sectional structural schematic diagram of a region B' in FIG. 1. In the related art, an organic light emitting display panel includes a profiled edge. In one embodiment, a cutout is provided at an edge of the display panel. Then, the edge of the display panel at the cutout is the profiled edge, and the region A' is a display region close to the cutout edge, while the region B' is a display region facing away from the edge of the display panel. The organic light emitting display panel includes an encapsulation film layer 1' and a touch film layer 2' that are sequentially stacked. The touch film layer 2' includes signal metal wires for implementing a touch function. An organic material layer is provided in the encapsulation film layer 1', and the organic material layer is formed by inkjet printing. However, in the process of forming the organic material layer, due to the fluidity of the organic material layer and the inkjet printing process, at a profiled edge of the organic material layer, i.e., at the region A', a thickness of the encapsulation film layer 1' gradually becomes thinner in a direction approaching to the edge. The touch film layer 2' is fabricated on the encapsulation film layer 1', and the fabricating process for the signal metal wires in the touch film layer 2' is as follows: fabricating a metal layer first, then fabricating photoresist on the metal layer, photoetching the photoresist to cause the photoresist to form a pattern, then spraying an etching solution on the photoresist having the pattern to etch away the metal exposed outside the photoresist with the etching solution to cause the metal layer to form a pattern, and finally, removing the photoresist to form the final signal metal wires. At the profiled edge, since the thickness of the encapsulation film layer 1' is relatively thin, more etching solution will accumulate thereon, resulting in that more metal will be etched away. However, in the non-profiled edge region, such as the region B', the change in thickness of the encapsulation film layer 1' is relatively small, so that a wire width of the signal metal wire in the touch film layer 2' is relatively large in the non-profiled edge region. Namely, the wire width a1' of the signal metal wire in the profiled edge region is smaller than the wire width a2' of the signal metal wire in the non-profiled edge region. Therefore, in the display region close to the profiled edge, the wire width a1' of the signal metal wire in the touch film layer 2' is relatively small, and it is easy for wire breakage to occur resulting in poor touch performance.

Figure 4:
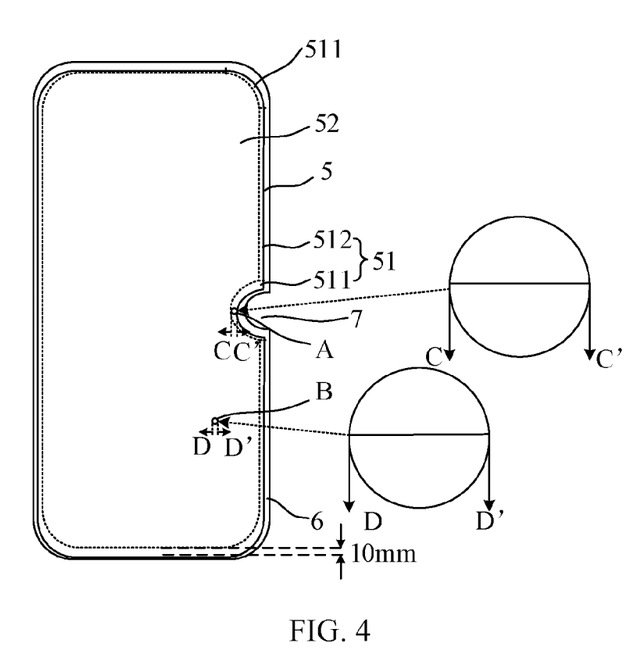
FIG. 4 illustrates a structural schematic diagram of an organic light emitting display panel according to an embodiment of the present disclosure.
Figure 5:
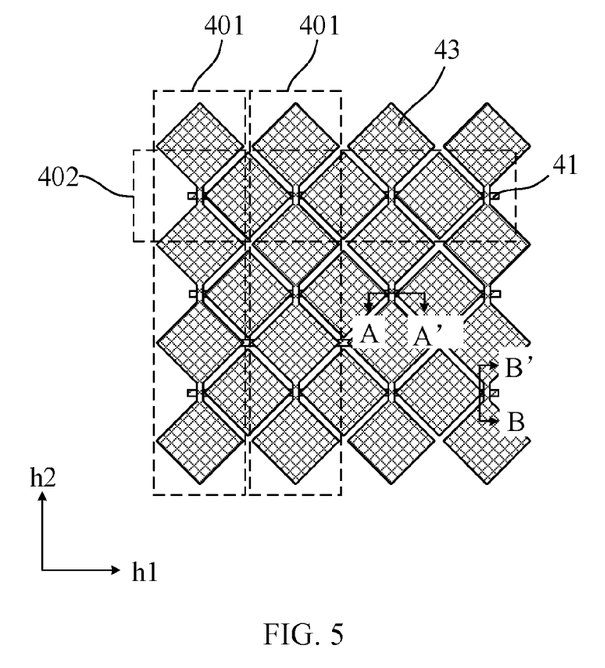
FIG. 5 illustrates a partially enlarged structural schematic diagram of a region A in FIG. 4.
Figure 6:
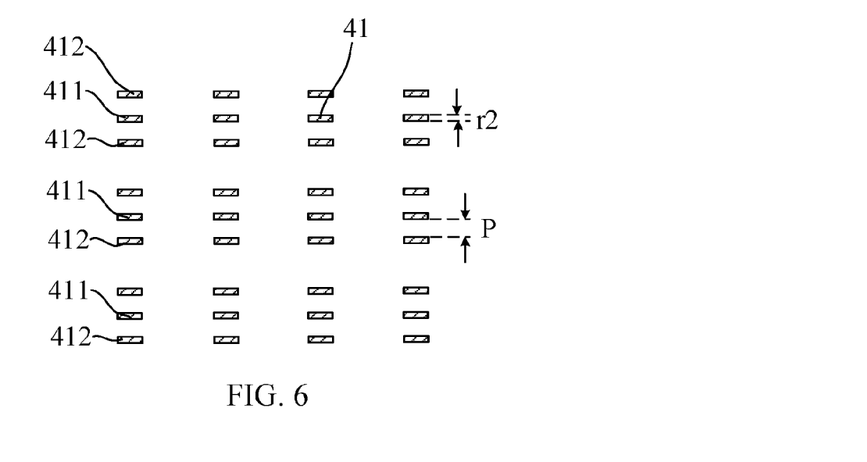
FIG. 6 illustrates a structural schematic diagram of a bridging metal layer in the region A in FIG. 4.
Figure 7:
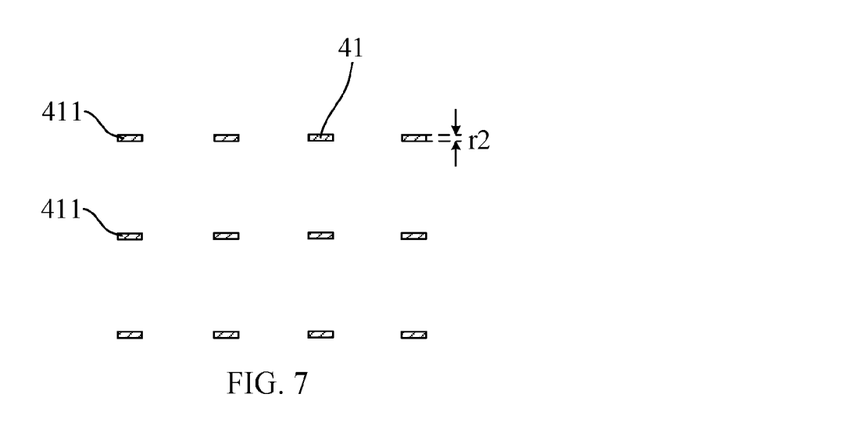
FIG. 7 illustrates a structural schematic diagram of a bridging metal layer in a region B in FIG. 4.
Figure 8:
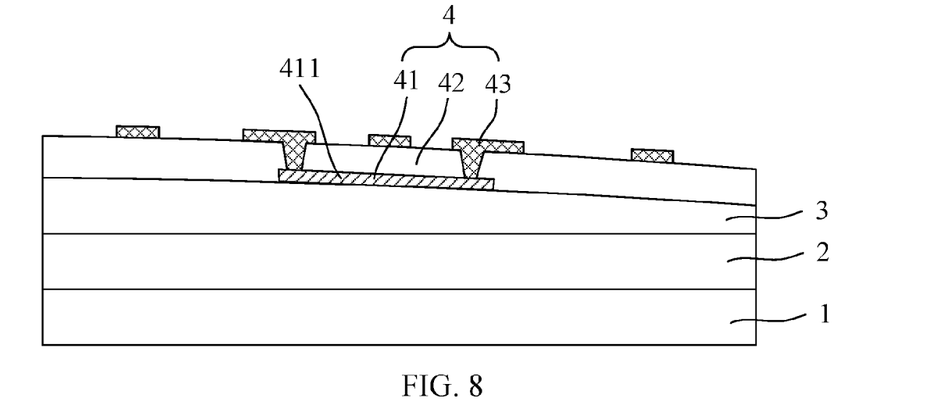
FIG. 8 illustrates a cross-sectional structural schematic diagram taken along a direction of AA' in FIG. 5.
Figure 9:
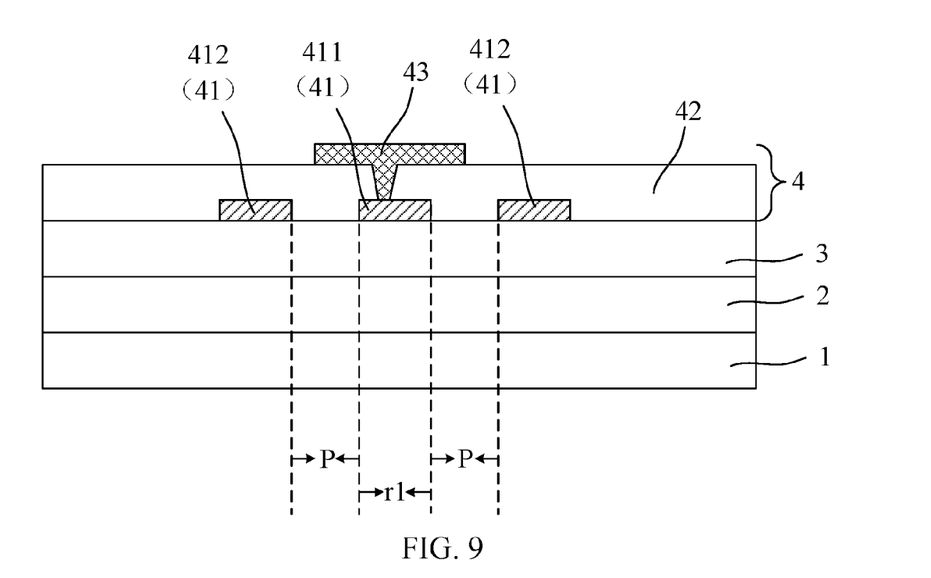
FIG. 9 illustrates a cross-sectional structural schematic diagram taken along a direction of BB' in FIG. 5.

As shown in FIG. 4, FIG. 5, FIG. 6, FIG. 7, FIG. 8, and FIG. 9, FIG. 4 illustrates a structural schematic diagram of an organic light emitting display panel according to an embodiment of the present disclosure; FIG. 5 illustrates a partially enlarged structural schematic diagram of a region A in FIG. 4; FIG. 6 illustrates a structural schematic diagram of a bridging metal layer in the region A in FIG. 4; FIG. 7 illustrates a structural schematic diagram of a bridging metal layer in a region B in FIG. 4; FIG. 8 illustrates a cross-sectional structural schematic diagram taken along a direction of AA' in FIG. 5; FIG. 9 illustrates a cross-sectional structural schematic diagram taken along a direction of BB' in FIG. 5. An embodiment of the present disclosure provides an organic light emitting display panel, including: a driving device film layer 1, a light emitting device film layer 2, an encapsulation film layer 3, and a touch film layer 4 that are sequentially stacked. The touch film layer 4 includes a bridging metal layer 41, a touch insulation layer 42 and a touch electrode metal layer 43 that are sequentially stacked. The organic light emitting display panel includes a display region 5 and a non-display region 6, and the display region 5 includes an edge display region 51 and a non-edge display region 52. The region B is in the non-edge display region 52. The edge display region 51 includes a profiled edge display region 511 and a straight edge display region 512. The region A is in the profiled edge display region 511. The bridging metal layer 41 includes dummy metal wires 412 located in the profiled edge display region 511 and signal metal wires 411. The signal metal wires 411 in the bridging metal layer 41 are distributed throughout the display region 5. Alternatively or additionally, the touch electrode metal layer 43 includes dummy metal wires located in the profiled edge display region 511 and signal metal wires. The signal metal wires in the touch electrode metal layer 43 are distributed throughout the display region 5. It should be noted that the signal metal wire is used to achieve the function of transmitting signals and the dummy metal wire is used to achieve the function of compensating the wire width of the signal metal wire. The textual description related to FIG. 6 and FIG. 9 illustrates, by way of example, the specific structural relationship of the signal metal wires 411 and the dummy metal wires 412 in the bridging metal layer 41 and the principle for compensating the signal metal wires 411 by the dummy metal wires 412, and the specific structural relationship and principle of the signal metal wires and the dummy metal wires in the touch electrode metal layer 43 are the same as above except for that the structure of the signal metal wires in the bridging metal layer 41 is different from that of the signal metal wires in the touch electrode metal layer 43.

Figure 10:
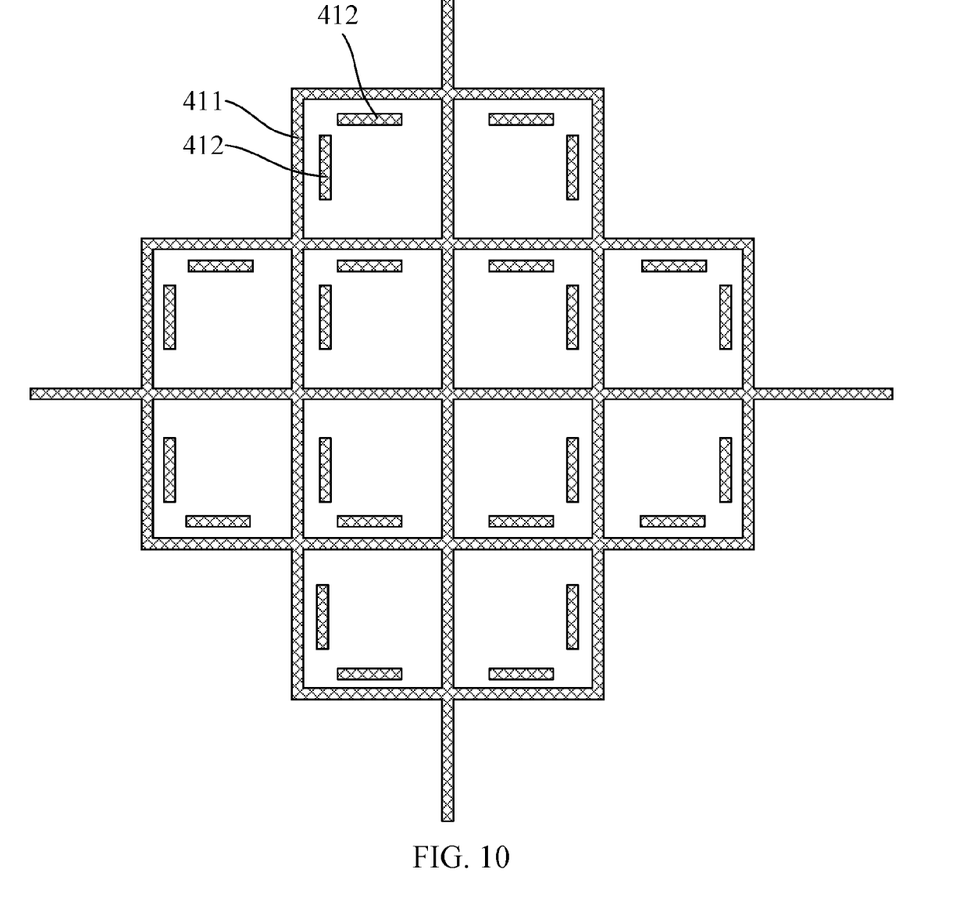
FIG. 10 illustrates an enlarged structural schematic diagram of part of a touch electrode metal layer in the region A in FIG. 4.
Figure 11:
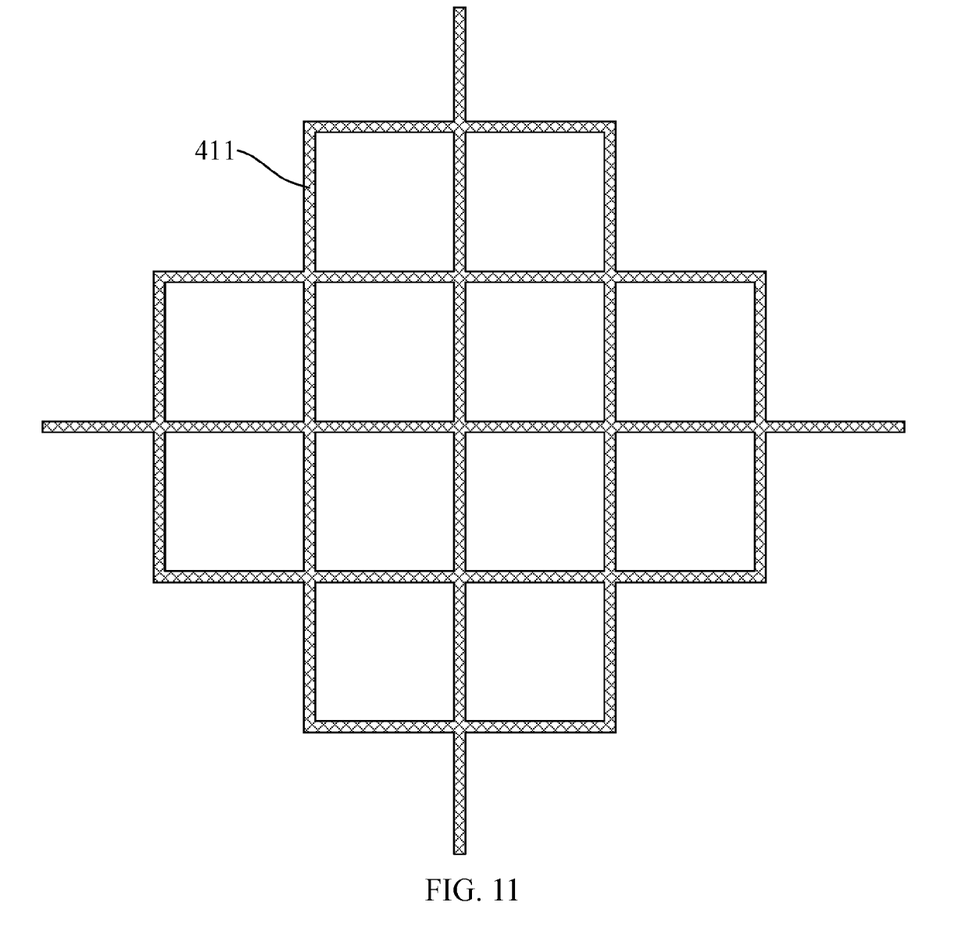
FIG. 11 illustrates an enlarged structural schematic diagram of part of a touch electrode metal layer in the region B in FIG. 4.

In one embodiment, as shown in FIG. 10 and FIG. 11, FIG. 10 illustrates an enlarged structural schematic diagram of part of a touch electrode metal layer in the region A in FIG. 4; FIG. 11 illustrates an enlarged structural schematic diagram of part of a touch electrode metal layer in the region B in FIG. 4. The touch electrode metal layer includes a grid touch electrode block formed by metal grid wires, and the metal grid wires are the signal metal wires 411 for transmitting touch signals. Moreover, as a touch electrode block, in the region A, i.e., in the profiled edge display region 511, dummy metal wires 412 are further provided, while in the region B, i.e., in the non-edge display region 52, only the signal metal wires 411 are provided. The shape, number, and position of the dummy metal wires 412 in FIG. 10 are only examples, and the embodiments of the present disclosure are not limited to this.

In the embodiments of the present disclosure, unless otherwise specified, all specific limitations related to the signal metal wire and the dummy metal wire can be understood as limitations on the signal metal wire 411 and the dummy metal wire 412 in the bridging metal layer 41, and can also be understood as limitations on the signal metal wire 411 and the dummy metal wire 412 in the touch electrode metal layer 43. In addition, the embodiments of the present disclosure may include three structures: a first structure in which both the bridging metal layer 41 and the touch electrode metal layer 43 are provided with the dummy metal wire 412, i.e., structures shown in FIG. 6 and FIG. 10 are located in the same organic light emitting display panel; a second structure in which the dummy metal wire 412 is provided only in the bridging metal layer 41 but is not provided in the touch electrode metal layer 43 in the organic light emitting display panel; a third structure in which the dummy metal wire 412 is provided only in the touch electrode metal layer 43 but is not provided in the bridging metal layer 41 in the organic light emitting display panel. In the embodiments of the present disclosure, limitations on the signal metal wire and the dummy metal wire can be understood as specific limitations on the signal metal wire and the dummy metal wire in any one of the bridging metal layer 41 and the touch electrode metal layer 43.

Figure 12:
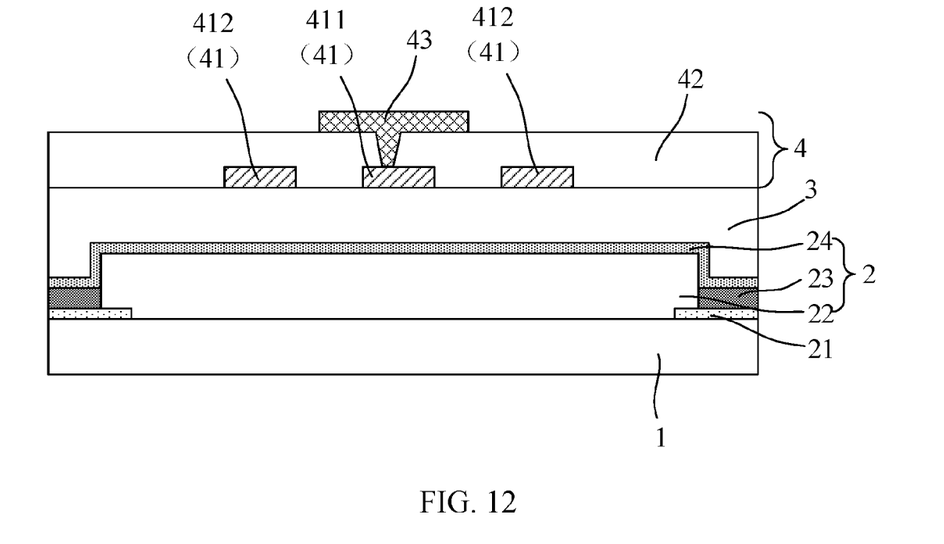
FIG. 12 illustrates another cross-sectional structural schematic diagram taken along a direction of BB' in FIG. 5.

As shown in FIG. 12, FIG. 12 illustrates another cross-sectional structural schematic diagram taken along a direction of BB' in FIG. 5. The light emitting device film layer 2 may include an anode layer 21, a pixel defining layer 22, an organic light emitting layer 23, and a cathode layer 24 that are sequentially stacked. In the display region 5, the pixel defining layer 22 includes openings corresponding to the respective sub-pixels. The anode layer 21 includes anodes corresponding to the respective sub-pixels. The opening of the pixel defining layer 22 exposes the anode, and the organic light emitting layer 23 is provided in the opening of the pixel defining layer 22. The cathode layer 24 covers the openings corresponding to the respective sub-pixels. Namely, at the openings corresponding to the respective sub-pixels, the anode layer 21, the organic light emitting layer 23, and the cathode layer 24 that are stacked to form one light emitting device. For the light emitting device, the cathode layer 24 and the anode layer 21 are respectively applied with a voltage, so that electrons and electron holes are injected into the organic light emitting layer 23 and recombined in the organic light emitting layer 23 releasing energy and emitting light, so as to achieve the display of sub-pixels. In order to avoid the adverse effect of the dummy metal wire 412 on the display, the dummy metal wire 412 may be located outside the opening of the pixel defining layer 22. Namely, in a direction perpendicular to the plane in which the organic light emitting display panel is located, an orthographic projection of the dummy metal wire 412 is located within an orthographic projection of the pixel defining layer 22. The dummy metal wire 412 is provided in the non-opening portion of the pixel defining layer, i.e., in the non-light emitting portion, so that it does not block the light emission of the sub-pixel and thus will not affect the normal display of the display panel. The driving device film layer 1 includes a pixel driving circuit (not shown in the drawing) corresponding to the respective sub-pixel, and the pixel driving circuit is used for driving the light emitting device to emit light. The driving device film layer 1 may further include peripheral circuits such as a scanning driving circuit. The touch film layer 4 is used to implement the touch function of the organic light emitting display panel. The touch film layer 4 includes first touch electrodes 401 and second touch electrodes 402. Multiple first touch electrodes 401 are arranged along a first direction h1 and extend along a second direction h2. Multiple second touch electrodes 402 are arranged along the second direction h2 and extend along the first direction h1. Each of the first touch electrodes 401 includes multiple first touch electrode blocks, and the multiple first touch electrode blocks are located on the touch electrode metal layer 43. In each of the first touch electrodes 401, any two adjacent first touch electrode blocks are directly connected through the touch electrode metal layer 43. Each of the second touch electrodes 402 includes multiple second touch electrode blocks, and the multiple second touch electrode blocks are located on the touch electrode metal layer 43. In each of the second touch electrodes 402, any two adjacent second touch electrode blocks are connected by the signal metal wire 411 in the bridging metal layer 41. One of the second touch electrode blocks is electrically connected to a first end of the signal metal wire 411 through a via hole in the touch insulation layer 42, while the other one of the second touch electrode blocks is electrically connected to a second end of the signal metal wire 411 through a via hole on the touch insulation layer 42. In addition, it should be noted that, although the first touch electrode block and the second touch electrode block are illustrated in FIG. 5 as continuous planar structures, FIG. 5 is only for illustration purpose. In fact, the first touch electrode block and the second touch electrode block are of grid structures, i.e., grid touch electrode blocks formed by connecting signal metal wires to each other and used for signal transmission. The signal metal wires in the touch electrode metal layer 43 in the present embodiment are the metal wire structures forming the first touch electrodes 401 and the second touch electrodes 402. The encapsulation film layer 3 is used to encapsulate the light emitting device in the display region to insulate the erosion of the light emitting device by the external water oxygen. An organic material layer is provided in the encapsulation film layer 3, and the organic material layer is formed by inkjet printing. However, in the process of forming the organic material layer, due to the fluidity of the organic material layer and the inkjet printing process, at the edge of the organic material layer, especially at the profiled edge, the organic material layer will gradually become thinner in a direction approaching to the edge of the organic material layer. Namely, at the profiled edge display region 511, in the direction perpendicular to the organic light emitting display panel, in the direction close to the edge of the organic light emitting display panel, the thickness of the encapsulation film layer 3 gradually becomes thinner. The touch film layer 4 is fabricated on the encapsulation film layer 3. In the profiled edge display region 511, the bridging metal layer 41 includes signal metal wires 411 and dummy metal wires 412. The signal metal wire 411 is used for transmitting signals to implement the touch function. In contrast, the dummy metal wire 412 does not need to receive electrical signals and is only used to be fabricated in the profiled edge display region 511, and a density of the metal wire pattern of the bridging metal layer 41 is increased in the profiled edge display region 511. The density of the metal wire pattern refers to the number of metal wires distributed within a certain range. The metal wire pattern here includes signal metal wires 411 and dummy metal wires 412. In the fabrication process of the bridging metal layer 41, a metal layer is fabricated first. Then photoresist is fabricated on the metal layer. Photoetching is performed on the photoresist to cause the photoresist to form a pattern. Then an etching solution is sprayed on the photoresist having a pattern to etch away the metal exposed outside the photoresist with the etching solution to cause the metal layer to form a pattern. Finally, the photoresist is removed to form the final metal wire. In the profiled edge display region 511, since the dummy metal wires 412 are added, the additionally added dummy metal wires 412 reduce the fluidity of the etching solution in the process of etching the metal wire. Although at the profiled edge display region 511, the thickness of the encapsulation film layer 3 becomes thinner, the amount of etching solution that would otherwise accumulate more around the signal metal wire 411 is reduced due to the action of the dummy metal wires 412 reducing the etched portion of the signal metal wire 411. Namely, through the compensation effect of the dummy metal wire 412, the wire width of the signal metal wire 411 is increased, and the probability of wire breakage caused by excessively etching of the signal metal wire 411 in the profiled edge display region 511 is reduced solving the problem of poor touch effect caused by wire breakage of the touch electrode at the profiled edge.

In another embodiment, in the metal etching process, there are two concepts of large area etching and small area etching. The large area etching is an etching manner in which a relatively large area of metal is etched away, and a metal pattern having a relatively small area is retained. The small area etching is an etching manner in which a relatively small area of metal is etched away, and a metal pattern having a relatively large area is retained.

TABLE 1

|  | Uniformity of Metal Pattern |
|---|---|
| Small Area Etching | 10.1% |
| Large Area Etching | 12.4% |

Figure 13:
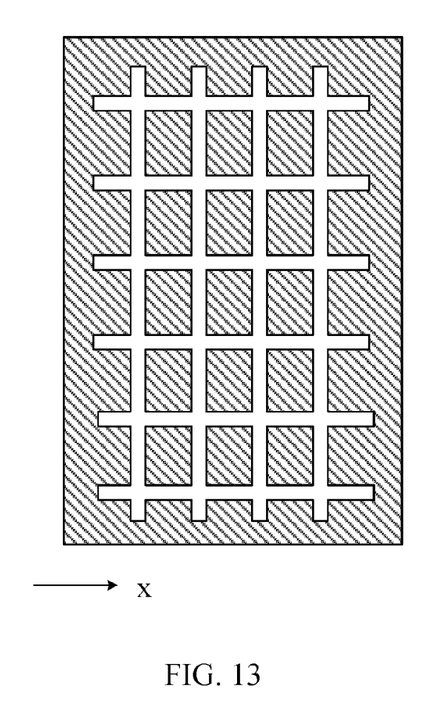
FIG. 13 illustrates a schematic diagram of a metal pattern corresponding to small area etching process.
Figure 14:
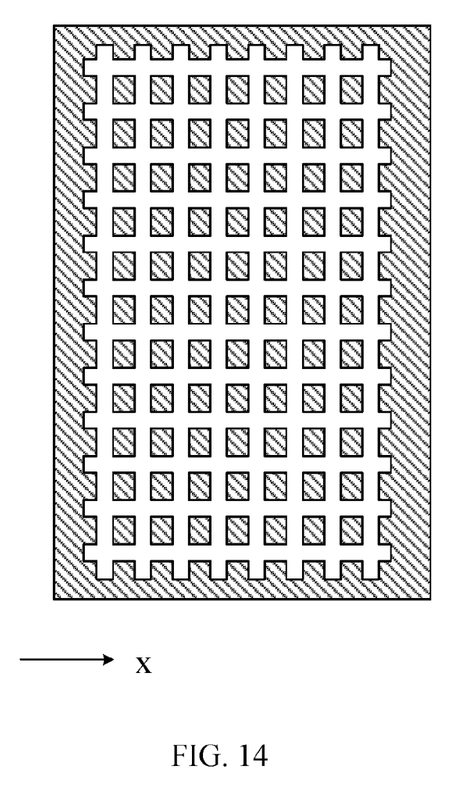
FIG. 14 illustrates a schematic diagram of a metal pattern corresponding to large area etching process.

As shown in FIG. 13, FIG. 14 and Table 1, FIG. 13 illustrates a schematic diagram of a metal pattern corresponding to small area etching process; FIG. 14 illustrates a schematic diagram of a metal pattern corresponding to large area etching process; and Table 1 illustrates the data of the uniformity of the metal pattern corresponding to the two etching processes. The two etching processes corresponding to FIG. 13 and FIG. 14 are based on metal layers of the same area and material. The blank region is the region where the metal is etched away, and the shaded region is the region where the metal is retained after the etching process. The area of the metal etched away in FIG. 13 is relatively small, i.e., a metal pattern having a larger area remains after the etching process. The area of the metal etched away in FIG. 14 is relatively large, i.e., a metal pattern having a small area remains after the etching process. In FIG. 13 and FIG. 14, what is required is rectangular metal patterns having the same dimension in an x-axis direction. The dimension of the island-shaped rectangular metal pattern in the drawing in the x-axis direction is defined as L. The dimension of any position in each land-shaped rectangular metal pattern in the x-axis direction is measured, and the maximum dimension is defined as Lmax and the minimum dimension is defined as Lmin. The uniformity of the metal pattern corresponding to FIG. 13=1−Lmin/Lmax=10.1%. the uniformity of the metal pattern corresponding to FIG. 14=1−Lmin/Lmax=12.4%. Thus, it can be seen that the lower the value of the uniformity of the metal pattern, the smaller the L difference corresponding to the rectangular metal pattern at each position, i.e., the better the uniformity; on the contrary, the higher the value, the larger the L difference corresponding to the rectangular metal pattern at each position, i.e., the worse the uniformity. Through experimental verification, it is found that the uniformity of the metal pattern after small area etching is better. Therefore, in the embodiments of the present disclosure, dummy metal wires 412 are added in the profiled edge display region 511, i.e., making the metal pattern in the profiled edge display region 511 closer to the case of the small area etching, so that the uniformity of the signal metal wires in the profiled edge display region 511 is improved, i.e., making the uniformity of the signal metal wires 411 in the profiled edge display region 511 better, i.e., making the difference between the different signal metal wires 411 smaller, to cause the impedances of the different signal metal wires 411 to be closer improving the uniformity of the load on the touch electrode and thus further improving the touch effect.

Optionally, the non-edge display region 52 is provided with signal metal wires 411 and is not provided with any dummy metal wire 412.

The non-edge display region 52 is the region facing away from the edge of the organic light emitting display panel. In the process of fabricating the encapsulation film layer 3, the organic material layer is evenly distributed in the non-edge display region 52, so that problems of slopes and thinning will not occur due to its own fluidity and the inkjet printing process. Thus, in the non-edge display region 52, in the process of fabricating the touch film layer 4 on the encapsulation film layer 3, the etching solution for etching the metal has a weak fluidity and will not accumulate around the signal metal wire 411. Therefore, after the etching is completed, the signal metal wire 411 of the touch film layer 4 in the non-edge display region 52 can reach a preset wire width, so that the non-edge display region 52 may not be provided with any dummy metal wire 412. Moreover, since the non-edge display region 52 is located at middle of the organic light emitting display panel for achieving the display of the main image and the metal is an opaque material, if providing too much, adverse influence will happen to the effect of the display image. Therefore, free of the dummy metal wires 412 in the non-edge display region 52 can reduce the adverse influence of the additional metal wires on the display effect.

Optionally, the non-edge display region 52 is provided with signal metal wires 411 and dummy metal wires 412. The distribution density of the dummy metal wires 412 in the profiled edge display region 511 is greater than that in the non-edge display region 52.

The distribution density of the dummy metal wires 412 refers to the number of dummy metal wires 412 provided in a unit area. The greater the distribution density of the dummy metal wires 412, the closer the etching of the metal wires in this region is to the small area etching process, i.e., the better the uniformity of the formed signal metal wires 411, the smaller the impedance difference between different signal metal wires 412; moreover, the greater the distribution density of the dummy metal wires 412, the greater the resistance effect on the etching solution in this region, the lower the fluidity of the etching solution, i.e., the less likely the etching solution is to accumulate around the signal metal wire 411, and the smaller the extent to which the etching solution excessively etches the signal metal wires 411. In order to improve the uniformity of the load on the touch electrodes in the non-edge display region 52, the dummy metal wires 412 can also be provided in the non-edge display region 52, and the uniformity of the load on the touch electrode is improved by reducing the impedance difference between different signal metal wires 412 improving the touch effect. However, since the thickness of the encapsulation film layer 3 in the edge display region 51 is thinner compared with that in the non-edge display region 52, the distribution density of the dummy metal wires 412 in the profiled edge display region 511 can be configured to be larger than that in the non-edge display region 52 in order to make the wire width of the signal metal wire 411 in the non-edge display region 52 tend to be consistent with the wire width of the signal metal wire 411 in the profiled edge display region 511. In this way, although the thickness of the encapsulation film layer 3 in the profiled edge display region 511 is relatively thin and the fluidity of the etching solution is relatively large, the fluidity of the etching solution is lowered due to the fact that distribution density of the dummy metal wires 412 in the profiled edge display region 511 is relatively large. In addition, the fluidity of the etching solution is negatively correlated with the wire width of the signal metal wire 411, so that the compensation to the wire width of the signal metal wire 411 is achieved by providing the dummy metal wires 412 having a larger distribution density making the wire width of the signal metal wire 411 in the non-edge display region 52 tend to be consistent with the wire width of the signal metal wire 411 in the profiled edge display region 511.

Optionally, the wire width r1 of the signal metal wire 411 in the profiled edge display region 511 is greater than or equal to the wire width r2 of the signal metal wire 411 in the non-edge display region 52.

For the profiled edge display region 511, the wire width of the metal wire here refers to the wire width of the signal metal wire 411 after being compensated by providing the dummy metal wire 412. Regarding to the non-edge display region 52, if the non-edge display region 52 is provided with the dummy metal wire 412, the metal wire width here also refers to the wire width of the signal metal wire 411 after being compensated by providing the dummy metal wire 412.

Namely, regardless of the region, the wire width of the signal metal wire 411 always refers to the actual wire width of the signal metal wire 411 in the product after the fabrication is completed through the etching process, rather than the designed wire width. The wire width is the dimension of the metal wire in the direction perpendicular to its length.

Optionally, the wire width r1 of the signal metal wire 411 in the profiled edge display region 511 is greater than the wire width r2 of the signal metal wire 411 in the non-edge display region 52. Since the sensing area between a user's finger and the touch electrode is relatively large when the user's finger is operating in the non-edge display region 52 and the sensing area between the user's finger and the touch electrode is relatively small when the user's finger is operating in the profiled edge display region 511, it is possible that, when the user performs a touch operation on the edge of the organic light emitting display panel, the generated induced current is relatively small due to the relatively small sensing area between the finger and the touch electrode. When the touch operation is determined based on the same induced current threshold, misjudgment may occur, i.e., resulting in relatively low touch sensitivity at the edge. Increasing the wire width r1 of the signal metal wire 411 in the profiled edge display region 511 is to increase the sensing area between the touch electrode and the user's finger at the profiled edge display region 511, so that the touch sensitivity at the edge can be increased. In addition, the non-edge display region 52 is located at middle of the organic light emitting display panel for achieving the display of the main image, and the metal is an opaque material, so that in the non-edge display region 52, the wire width r2 of the signal metal wire 411 is relatively small, and the adverse influence on the display effect is relatively small.

Optionally, the edge display region 51 includes a straight edge display region 512. The signal metal wire 411 and the dummy metal wire 412 are provided in the straight edge display region 512. The distribution density of the dummy metal wires 412 in the profiled edge display region 511 is greater than that in the straight edge display region 512.

Due to the process, the encapsulation film layer 3 in the straight edge display region 512 also becomes thinner with respect to the encapsulation film layer 3 in the non-edge display region 52. However, the degree of thinning is smaller compared with the case of the profiled edge display region 511. The degree of thickness variation of the encapsulation film layer 3 is positively correlated with the fluidity of the etching solution, the fluidity of the etching solution is negatively correlated with the wire width of the signal metal wire 411, and the distribution density of the dummy metal wire 412 is negatively correlated with the fluidity of the etching solution. Therefore, in order to increase the wire width of the signal metal wire 411 in the straight edge display region 512, the dummy metal wires 412 are also provided in the straight edge display region 512, and the distribution density of the dummy metal wires 412 in the profiled edge display region 511 is greater than the distribution density in the straight edge display region 512. By respectively providing dummy metal wires 412 in the profiled edge display region 511 and the straight edge display region 512 with different distribution densities, the difference in the fluidity of the etching solution in these two regions caused by the difference in the degree of thickness variation of the encapsulation film layer 3 is compensated, and the wire widths of the signal metal wires 411 in the respective regions tend to be consistent.

Optionally, the edge display region 51 is an annular region surrounding the non-edge display region 52, and a width of the annular region is 10 mm. The portion of the display region 5 other than the non-edge display region 52 is the edge display region 51. Namely, within the annular region of 10 mm at the outermost edge of the display region 5, a dummy metal wire for increasing the wire width of the signal metal wire may be provided.

Optionally, the wire width of the signal metal wire 411 in the profiled edge display region 511 is r1, $1.5\ \mu m \leq r1 \leq 6\ \mu m$. This wire width can achieve the signal transmission effect and prevent the problem of wire breakage under the premise of having less influence on the display effect.

Optionally, in the profiled edge display region 511, the organic light emitting display panel includes multiple signal metal wires 411 and at least one dummy metal wire 412 corresponding to each signal metal wire 411. A distance between the signal metal wire 411 and the corresponding dummy metal wire 412 is p, $3\ \mu m \leq p \leq 100\ \mu m$. Thus, it can be achieved that the distance between the dummy metal wire 412 and the signal metal wire 411 is within a certain range, which can better hinder the flow of the etching solution without causing a short circuit between the different metal wires.

Optionally, the dummy metal wires 412 and the signal metal wires 411 have the same shape. If the dummy metal wire 412 and the signal metal wire 411 have the same shape and dimension, and if for each signal metal wire 411, the dummy metal wires 412 are provided around it in the same arrangement manner, then it can be achieved that the etching solution around each signal metal wire 411 has the same fluidity when the metal pattern is etched by the etching solution, i.e., a more uniform etching effect can be achieved. Without doubt, it can be understood that in other implementable embodiments, shapes of the dummy metal wire 412 and the signal metal wire 411 can be configured to be different. In one embodiment, the signal metal wire is of a long rectangular shape, and the dummy metal wire is of an arc shape, or the dummy metal wire is of an annular shape surrounding the perimeter of the signal metal wire.

Optionally, the touch electrode metal layer 43 is located on a side of the bridging metal layer 41 facing way from the encapsulation film layer 3.

Optionally, the encapsulation film layer 3 includes an organic material layer.

Figure 15:
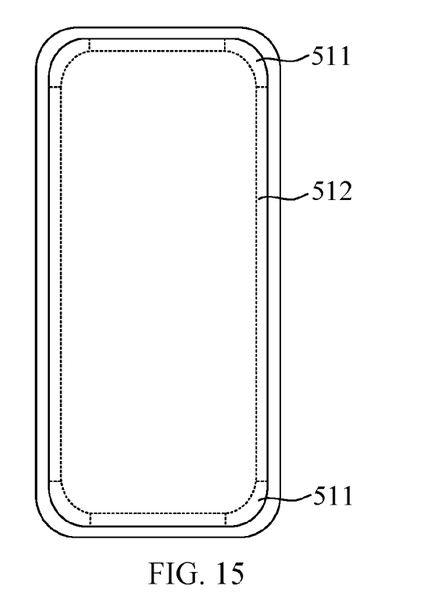
FIG. 15 illustrates a structural schematic diagram of another organic light emitting display panel according to an embodiment of the present disclosure.

Optionally, as shown in FIG. 4 and FIG. 15, FIG. 15 illustrates a structural schematic diagram of another organic light emitting display panel according to an embodiment of the present disclosure. The organic light emitting display panel is a rounded rectangle, and the rounded rectangle includes a straight edge and an arc edge. The region adjacent to the arc edge is a profiled edge display region 511.

In the structure shown in FIG. 15, only the profiled edge display region 511 corresponding to the rounded arc is included, while in the structure shown in FIG. 4, both the profiled edge display region 511 corresponding to the rounded arc and the profiled edge display region 511 corresponding to the edge cutout are included. At the edge cutout 7, other components such as a front camera can be provided.

Optionally, as shown in FIG. 4, the organic light emitting display panel has a straight edge and the cutout 7 recessed from the straight edge towards the middle of the organic light emitting display panel. The organic light emitting display panel has a profiled edge at the cutout 7, and the display region adjacent to the profiled edge is the profiled edge display region 511.

Figure 16:
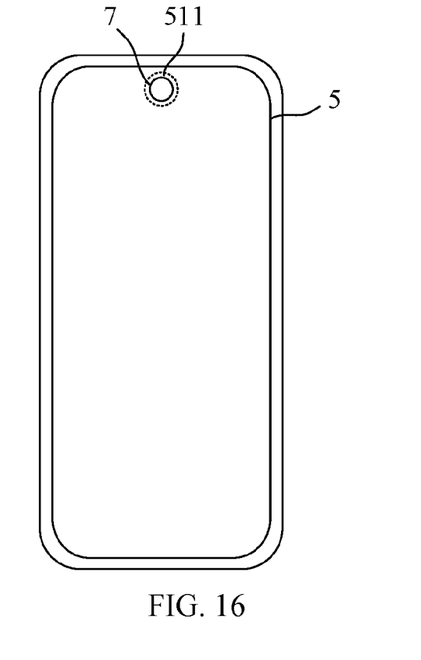
FIG. 16 illustrates a structural schematic diagram of still another organic light emitting display panel according to an embodiment of the present disclosure.

Optionally, FIG. 16 illustrates a structural schematic diagram of another organic light emitting display panel according to an embodiment of the present disclosure. The organic light emitting display panel has a cutout 7 surrounded by the display region 5. The organic light emitting display panel has a profiled edge at the cutout 7, and the display region adjacent to the profiled edge is the profiled edge display region 511. At the cutout 7, other components such as a front camera can be provided.

Figure 17:
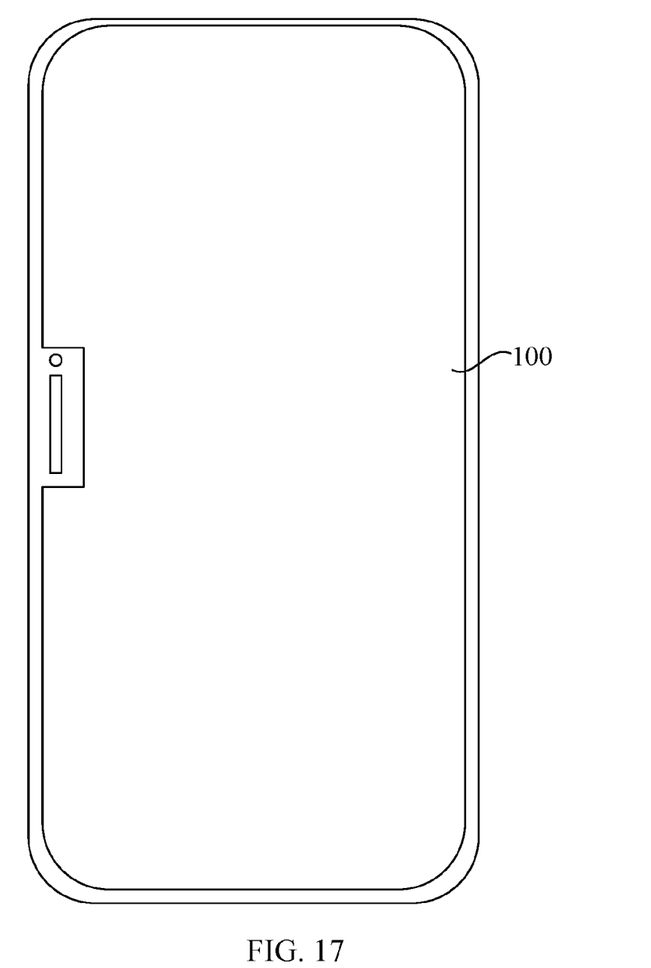
FIG. 17 illustrates a structural schematic diagram of a display device according to an embodiment of the present disclosure.
Figure 18:
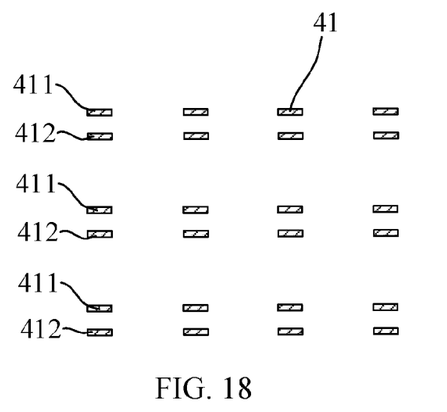
FIG. 18 illustrates a structural schematic diagram of a bridging metal layer in a region B in FIG. 4 according to another exemplary embodiment.

As shown in FIG. 17, FIG. 17 illustrates a structural schematic diagram of a display device according to an embodiment of the present disclosure. An embodiment of the present disclosure further provides a display device including the organic light emitting display panel 100 described above.

The display device in the embodiment of the present disclosure may be any electronic device having a display function, such as a touch display screen, a mobile phone, a tablet computer, a laptop computer, an electronic paper book, or a television.

The display device of the embodiments of the present disclosure is additionally provided with the dummy metal wire in the profiled edge display region, so that the additionally provided dummy metal wire reduces the fluidity of the etching solution in the process of etching the metal wire. Although the thickness of the encapsulation film layer becomes thinner in the profiled edge display region, the amount of the etching solution that would otherwise accumulate around the signal metal wire is reduced due to the function of the dummy metal wire reducing the etched portion of the signal metal wire. Namely, through the compensation effect of the dummy metal wire, the wire width of the signal metal wire is increased, and the probability of wire breakage caused by excessively etching of the signal metal wire in the profiled edge display region is reduced solving the problem of poor touch effect caused by wire breakage of the touch electrode at the profiled edge. In another embodiment, in the metal etching process, there are two concepts of large area etching and small area etching. The large area etching is an etching manner in which a relatively large area of metal is etched away, and a metal pattern having a relatively small area of is retained. The small area etching is an etching manner in which a relatively small area of metal is etched away, and a metal pattern having a relatively large area is retained. Through experimental verification, it is found that the uniformity of the metal pattern after the small area etching is better. Therefore, in the embodiment of the present disclosure, a dummy metal wire is added in the profiled edge display region, i.e., making the metal pattern in the profiled edge display region closer to the small area etching, so that the uniformity of the signal metal wires in the profiled edge display region is improved, and the uniformity of the load on the touch electrode is improved further improving the touch effect.

The above are only the preferred embodiments of the present disclosure and are not intended to limit the present disclosure. Any modifications, equivalents, improvements, etc., which are made within the spirit and principles of the present disclosure, should be included in the scope of the present disclosure.

What is claimed is:

1. An organic light emitting display panel, comprising:
a driving device film layer, a light emitting device film layer, an encapsulation film layer and a touch film layer that are sequentially stacked;
wherein the touch film layer comprises a bridging metal layer, a touch insulation layer and a touch electrode metal layer that are sequentially stacked;
the organic light emitting display panel has a display region, the display region comprises an edge display region and a non-edge display region, and the edge display region comprises a profiled edge display region; and
at least one of the bridging metal layer and the touch electrode metal layer comprises a plurality of dummy metal wires and a signal metal wire, the plurality of dummy metal wires being located in the profiled edge display region.

2. The organic light emitting display panel according to claim 1, wherein
the signal metal wire is provided in the non-edge display region and no dummy metal wire is provided in the non-edge display region.

3. The organic light emitting display panel according to claim 1, wherein
the signal metal wire and the plurality of dummy metal wires are provided in the non-edge display region, and a distribution density of the plurality of dummy metal wires in the profiled edge display region is greater than a distribution density of the plurality of dummy metal wires in the non-edge display region.

4. The organic light emitting display panel according to claim 1, wherein
a wire width of the signal metal wire in the profiled edge display region is greater than or equal to a wire width of the signal metal wire in the non-edge display region.

5. The organic light emitting display panel according to claim 4, wherein
the wire width of the signal metal wire in the profiled edge display region is greater than the wire width of the signal metal wire in the non-edge display region.

6. The organic light emitting display panel according to claim 1, wherein
the edge display region further comprises a straight edge display region in which the signal metal wire and at least one of the plurality of dummy metal wires is provided, and a distribution density of the at least one the plurality of dummy metal wires in the profiled edge display region is greater than a distribution density of the at least one of the plurality of dummy metal wires in the straight edge display region.

7. The organic light emitting display panel according to claim 1, wherein
the edge display region is an annular region surrounding the non-edge display region, the annular region has a width of 10 mm, and a portion of the display region other than the non-edge display region is the edge display region.

8. The organic light emitting display panel according to claim 1, wherein
a wire width of the signal metal wire in the profiled edge display region is r1, wherein $1.5\ \mu m \leq r1 \leq 6\ \mu m$.

9. The organic light emitting display panel according to claim 1, wherein
in the profiled edge display region, the organic light emitting display panel comprises a plurality of signal metal wires, the at least one of the plurality of dummy metal wires corresponds to each of the plurality of signal metal wires, and a distance between each of the plurality of signal metal wires and a respective one of the at least one of the plurality of dummy metal wires is p, where $3\ \mu m \leq p \leq 100\ \mu m$.

10. The organic light emitting display panel according to claim 1, wherein
the at least one of the plurality of dummy metal wires and the signal metal wire have same shapes.

11. The organic light emitting display panel according to claim 1, wherein
the touch electrode metal layer is located on a side of the bridging metal layer facing away from the encapsulation film layer.

12. The organic light emitting display panel according to claim 1, wherein
the encapsulation film layer comprises an organic material layer.

13. The organic light emitting display panel according to claim 1, wherein
the organic light emitting display panel is of a rounded rectangle comprising a straight edge and an arc edge, and a region close to the arc edge is the profiled edge display region.

14. The organic light emitting display panel according to claim 1, wherein
the organic light emitting display panel comprises a straight edge and a cutout recessing from the straight edge towards a middle portion of the organic light emitting display panel, the organic light emitting display panel comprises a profiled edge at the cutout, and a part of the display region close to the profiled edge is the profiled edge display region.

15. The organic light emitting display panel according to claim 1, wherein
the organic light emitting display panel comprises a cutout surrounded by the display region, the organic light emitting display panel comprises a profiled edge at the cutout, and a part of the display region close to the profiled edge is the profiled edge display region.

16. A display device comprising an organic light emitting display panel, the organic light emitting display panel comprising:
a driving device film layer, a light emitting device film layer, an encapsulation film layer and a touch film layer that are sequentially stacked;
wherein the touch film layer comprises a bridging metal layer, a touch insulation layer and a touch electrode metal layer that are sequentially stacked;
the organic light emitting display panel has a display region, the display region comprises an edge display region and a non-edge display region, and the edge display region comprises a profiled edge display region; and
at least one of the bridging metal layer and the touch electrode metal layer comprises a plurality of dummy metal wires and a signal metal wire, the plurality of the dummy metal wires being located in the profiled edge display region.

* * * * *